US009032346B2

(12) United States Patent
Filippi et al.

(10) Patent No.: US 9,032,346 B2
(45) Date of Patent: May 12, 2015

(54) METHOD AND APPARATUS FOR CREATING AND MANAGING WAIVER DESCRIPTIONS FOR DESIGN VERIFICATION

(75) Inventors: Raymond A. Filippi, Singapore (SG); Paul Soh, Singapore (SG); Hui May Tan, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 240 days.

(21) Appl. No.: 13/111,418

(22) Filed: May 19, 2011

(65) Prior Publication Data

US 2012/0297352 A1 Nov. 22, 2012

(51) Int. Cl.
*G06F 17/50* (2006.01)

(52) U.S. Cl.
CPC .................................. *G06F 17/5081* (2013.01)

(58) Field of Classification Search
CPC ............ G06F 17/5045; G06F 17/5022; G06F 17/504; G06F 17/5068; G03F 1/144
USPC .............. 716/100–102, 106, 107, 139, 52, 54
See application file for complete search history.

(56) References Cited

U.S. PATENT DOCUMENTS

| 8,086,981 | B2 * | 12/2011 | Lai et al. ........................ 716/111 |
| 8,091,055 | B2 * | 1/2012 | Brelsford et al. .............. 716/111 |
| 8,321,357 | B2 * | 11/2012 | Lapir et al. ..................... 706/12 |
| 2007/0124709 | A1 * | 5/2007 | Li et al. ............................. 716/5 |
| 2007/0192754 | A1 * | 8/2007 | Hofsaess ........................... 716/5 |
| 2008/0127020 | A1 * | 5/2008 | Rittman .......................... 716/10 |
| 2010/0064269 | A1 * | 3/2010 | Lai et al. ............................ 716/5 |
| 2010/0070936 | A1 * | 3/2010 | Lakshmanan et al. ............ 716/4 |
| 2010/0192113 | A1 * | 7/2010 | Brelsford et al. ................. 716/5 |
| 2010/0205575 | A1 * | 8/2010 | Arora et al. ...................... 716/11 |
| 2011/0078098 | A1 * | 3/2011 | Lapir et al. ...................... 706/12 |
| 2011/0265054 | A1 * | 10/2011 | Ferguson et al. ............. 716/112 |

OTHER PUBLICATIONS

Ferguson, John "Automated DRC Violation Waiver Management for IP Block Integration" IEEE (2009) pp. 1-9.
Ferguson, John Automated DRC Waiver Management (or, How I Learned to Stop Worrying about IP Waivers and Love Calibre Auto-Waiver), Mentor Graphics (2009) pp. 1-13.
N.A., "Calibre Automatic Waivers" Mentor Graphics Corporation (2010) pp. 1-2.
Puryear, Jason "Enchancing the DRC Waiver Methodology for Layout Verification Productivity" Synopsys Predictable Success, May 2009, pp. 1-6.

* cited by examiner

*Primary Examiner* — Stacy Whitmore
(74) *Attorney, Agent, or Firm* — Ditthavong & Steiner, P.C.

(57) ABSTRACT

Methods are provided to facilitate automated creation and management of design rule checking or DRC waiver descriptions. Embodiments include receiving a plurality of first checksums corresponding to respective first geometric element violations waived in association with a block of an integrated circuit design, the first checksums being based on a first version of at least one design verification rule and/or of the block, receiving a second checksum corresponding to a second geometric element violation associated with the block, the second checksum being based on a second version of the design verification rule and/or of the block, determining whether the second checksum corresponds to at least one of the first checksums, and, if the second checksum does not correspond to at least one first checksum, generating a waiver request for the second geometric element error.

23 Claims, 7 Drawing Sheets

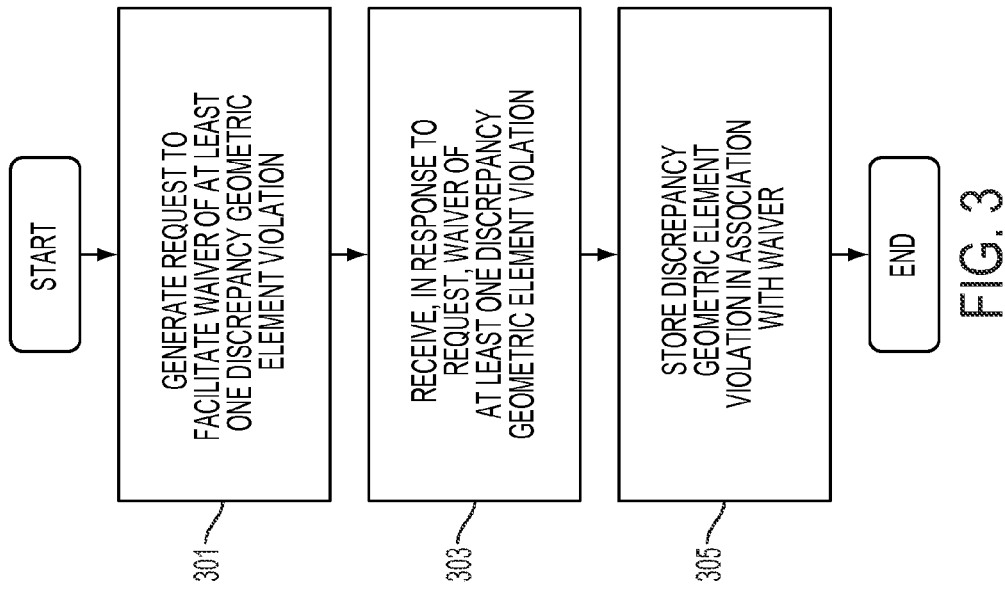
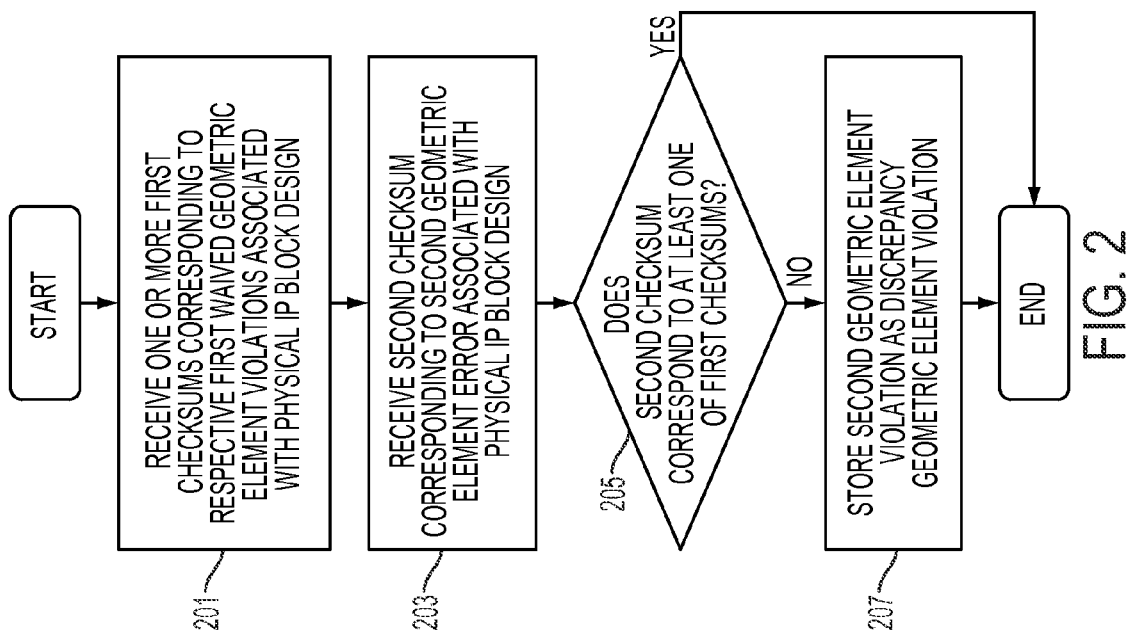

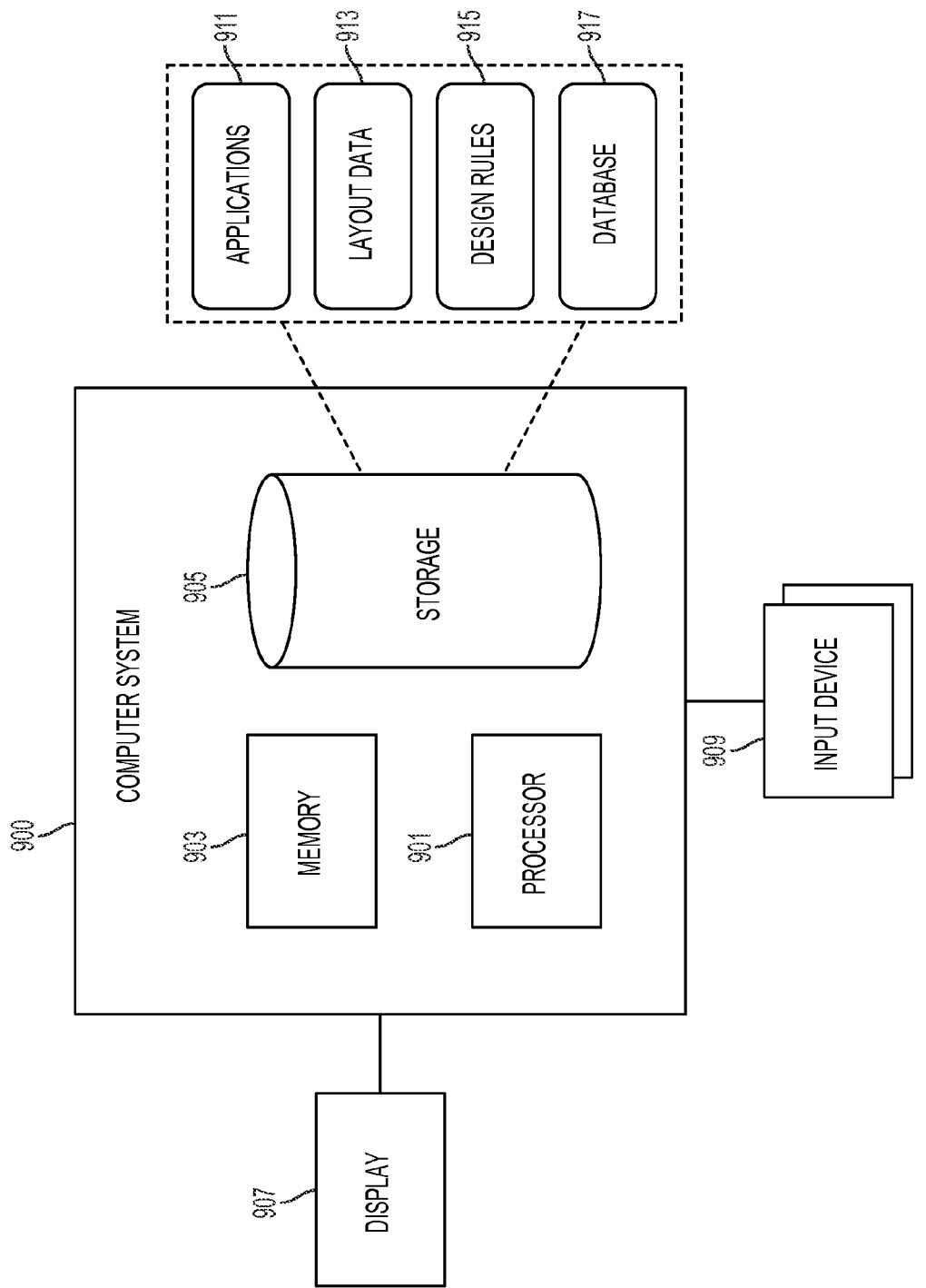

METHOD AND APPARATUS FOR CREATING AND MANAGING WAIVER DESCRIPTIONS FOR DESIGN VERIFICATION

TECHNICAL FIELD

The present disclosure relates to technology for implementing electronic design automation tools, and in particular, to electronic design automation tools for creating and managing waiver descriptions to facilitate design verification.

BACKGROUND

Manufacturers of semiconductors regard testing and evaluation processes as indispensable stages of their design and production operations. Semiconductors, also known as integrated circuits (IC), are electronic circuits that process, store, and move information. Operations associated with the production of semiconductors involve substantial investment of resources. Consequently, it is advantageous to verify IC designs prior to committing the designs to full scale manufacturing.

Accordingly, design verification is an important stage in validating an IC layout. One form of design verification involves one or more design rule checking (DRC) processes, which may be performed by design verification decks incorporating one or more design verification rules (hereinafter "design rules") governing "permissible" physical layouts of, for instance, a full IC design, such as a full system on chip (SoC) design. Design rules are generally defined by a foundry, i.e., a semiconductor processing facility configured to manufacture SoC designs from, for example, silicon wafers. Design verification decks apply the design rules against the actual physical layout of a design to determine layout drawn errors, also commonly referred to as design verification violations, e.g., DRC violations or design verification errors. With the continuing decrease in IC feature sizes, design rules are becoming evermore complex and restrictive to ensure a suitably manufacturable and operable end product. Design rules, however, are typically conservative, and, as a result, are usually incrementally revised over time. Further, full SoC designs usually incorporate one or more blocks of intellectual property (IP), which may also be incrementally revised over time. This flux in design rules often necessitates revised design verification decks that include the revised design rules. Revisions, however, to the design rules and/or physical IP block designs may result in new true/false design verification violations being reported in association with existing physical IP block designs. These design verification violations may be classified, such as waived, for particular handling purposes during design verification operations, but DRC violation waivers are generally only authorized by the foundry. Although the term "waivers" will be used throughout this disclosure, waivers are to be regarded as illustrative and not as restrictive, and other types of design verification classifications are to be encompassed by this disclosure.

Most other areas of electronic design automation (EDA) tools have been steadily improving in terms of productivity in the design phase of an IC. Design verification tools, such as design verification tools to create and manage design verification violation waivers, have been less productive, resulting in increased design cycle schedules and a boost in the consumption of valuable resources. Accordingly, creation and management of design verification violation waivers is becoming increasingly more important, especially with regard to the automation of design verification operations. More specifically, automated design verification waiver flows would not only enable IC designers to significantly reduce their time to resolve false design verification violations, but would also enable IC designers to reduce time to tapeout and manufacture.

In addition, checksums are employed as a way of uniquely defining a drawn layout with a unique numeric number. An IP_Checksum refers to a single checksum that uniquely identifies an IP block geometric layout by a checksum. A Cell_Checksum is similar to an IP_Checksum and is applicable where the IP is a library of cells, and each cell can have its own unique checksum. A Polygon_Checksum is a checksum for a single polygon. If one vertex moved in a layout, the resulting checksum will be different. The algorithm for a checksum can be proprietary to the specific EDA vendor. Therefore, layout DRC error waiver description files, which are provided in graphical data system (GDS or OASIS) format and contain such checksums (that uniquely provide a fingerprint of the total layout of the DRC waiver polygons for that IP block), are EDA vendor specific.

A need, therefore, exists for methodology enabling efficient creation and management of design verification waivers. There exists a particular need for methodology enabling efficient creation and management of design verification waivers in batch mode processes that are capable of handling multiple revisions of design verification rules and/or multiple revisions of physical IP block designs. A further need exists for methodology for creating and providing to users waiver description files which do not include checksums and have a generic format.

SUMMARY

An aspect of the present disclosure is a method for enabling the automated creation and management of design verification waiver descriptions, for multiple revisions of design verification rules.

Another aspect of the present disclosure is a method for enabling the creation and management of design verification waiver descriptions, for multiple revisions of physical IP block designs.

A further aspect of the present disclosure is a method for utilizing design verification waiver descriptions during design verification (e.g., DRC) of a full SoC design including one or more physical IP block designs.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: receiving a plurality of first checksums corresponding to respective first geometric element errors waived in association with a block of an integrated circuit design, the plurality of first checksums being based on a first version of at least one design verification rule; receiving a second checksum corresponding to a second geometric element error associated with the block, the second checksum being based on a second version of the at least one design verification rule; determining whether the second checksum corresponds to at least one of the plurality of first checksums; and generating, if the second checksum does not correspond to at least one of the plurality of first checksums, a waiver request for the second geometric element error.

Aspects of the present disclosure include receiving, in response to the waiver request, an indication that the second geometric element error comprises a false geometric element error. Another aspect includes storing, in response to receiving the indication, a plurality of third checksums, wherein the plurality of third checksums correspond to waivers of the respective first geometric element errors and the second geometric element error. Other aspects include storing the plurality of third checksums in association with an identifier associated with a cell of the block. Additional aspects include the identifier having one or more checksums corresponding to one or more DRC error polygons in the block. Further aspects include the identifier having a name corresponding to the cell of the block. Other aspects include generating waiver information characterizing the respective first geometric element errors and the second geometric element error. Another aspect includes formatting the waiver information in accordance with an ASCII format.

Another aspect of the present disclosure is a method including: receiving a plurality of first checksums corresponding to respective first geometric element errors waived in association with a first version of a block of an integrated circuit design; receiving a second checksum corresponding to a second geometric element error waived in association with a second version of the block; determining whether the second checksum corresponds to at least one of the plurality of first checksums; and generating, if the second checksum does not correspond to at least one of the plurality of first checksums, a wavier request for the second geometric element error.

Aspects of the present disclosure include receiving, in response to the waiver request, an indication that the second geometric element error includes a false geometric element error. Another aspect includes storing, in response to receiving the indication, a plurality of third checksums, wherein the plurality of third checksums correspond to waivers of the respective first geometric element errors and the second geometric element error. Other aspects include storing the plurality of third checksums in association with an identifier associated with a cell of the second version of the block. Additional aspects include the identifier having a checksum corresponding to the cell of the second version of the block. Further aspects include the identifier having a name corresponding to the cell of the second version of the block. Other aspects include generating waiver information characterizing the respective first geometric element errors and the second geometric element error. Another aspect includes formatting the waiver information in accordance with an ASCII format.

Another aspect of the present disclosure is a method including: analyzing, based on at least one design verification rule, layout data corresponding to an integrated circuit including a block of intellectual property having at least one geometric element; generating, if the at least one geometric element violates at least one design verification rule, at least one geometric element error; comparing the at least one geometric element error with waiver information stored in association with a version of the block; disregarding the at least one geometric element error if the at least one geometric element error corresponds to at least some of the waiver information.

Aspects of the present disclosure include the waiver information being further stored in association with a version of the at least one design verification rule. Another aspect includes retrieving the waiver information based on one or more of the version of the block and the version of the at least on verification rule. Other aspects include the waiver information being formatted in accordance with an ASCII format.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 2 is a flowchart of a process for determining discrepancy geometric element violations, according to an exemplary embodiment;

FIG. 3 is a flowchart of a process for waiving discrepancy geometric element violations, according to an exemplary embodiment;

FIG. 9 schematically illustrates a computer system, according to an exemplary embodiment.

DETAILED DESCRIPTION

Figure 1:
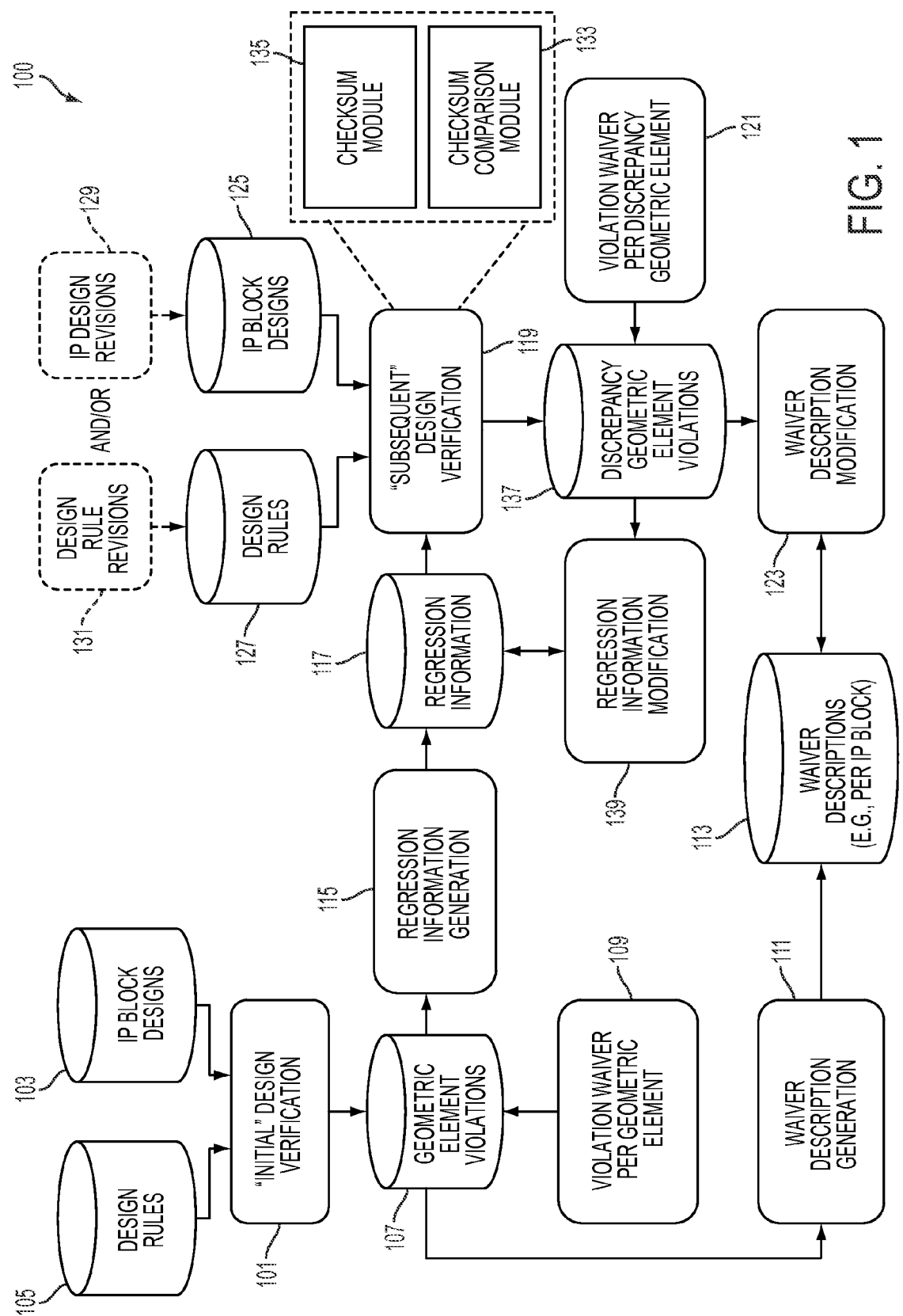
FIG. 1 schematically illustrates a process flow for creating and managing waiver descriptions, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increasing time and resources spent managing design verification waivers associated with physical IP block design verification violations. In accordance with embodiments of the present disclosure, design verification violation waivers may be created and managed in batch modes at various physical IP block design granularities, such as, for instance, on a per geometric element per physical IP block design basis, or on a per geometric element per cell per physical IP block design basis. These batch mode processes further enable automated modification of existing physical IP block design verification violation waivers in response to, for instance, revisions to one or more aspects of at least one design rule and/or revisions to one or more aspects of at least one geometric element associated with a physical IP block design or a cell of a physical IP block design. Further, batch mode processing may be facilitated through the utilization of one or more names and/or checksums, such as one or more names and/or checksums associated with physical IP block designs, cells of physical IP block designs, geometric elements of physical IP block designs, and the like.

Waiver information may be created, managed, and distributed to IC designers, such as fabless IC designers. This waiver information may be created, managed, and distributed in one or more waiver descriptions. In certain embodiments, respective physical IP block designs may be correspondingly associated with respective design verification waiver descriptions. As such, modifications to a physical IP block design may, but need not, result in modification and distribution of a revised waiver description associated with the revised version of the physical IP block design. Revisions to at least one design rule applied against at least one physical IP block design may, but need not, result in modification and distribution of at least one waiver description correspondingly associated with the at least one physical IP block design upon which the revised design rule is applied.

Methodology in accordance with embodiments of the present disclosure includes: receiving a plurality of first checksums corresponding to respective first geometric element errors waived in association with a block of an integrated circuit design, the plurality of first checksums being based on a first version of at least one design verification rule, receiving a second checksum corresponding to a second geometric element error associated with the block, the second checksum being based on a second version of the at least one design verification rule, determining whether the second checksum corresponds to at least one of the plurality of first checksums, and generating, if the second checksum does not correspond to at least one of the plurality of first checksums, a waiver request for the second geometric element error. Alternatively, the first and second checksums may correspond to respective first and second geometric element errors waived in association with respective first and second versions of a block of an integrated circuit design, rather than on different design rules.

Further, methodology in accordance with embodiments of the present disclosure includes: analyzing, based on at least one design rule, layout data corresponding to an integrated circuit including a block of intellectual property having at least one geometric element, generating, if the at least one geometric element violates the at least one design rule, at least one geometric element error, comparing the at least one geometric element error with waiver information stored in association with a version of the block, and disregarding the at least one geometric element error if the at least one geometric element error corresponds to at least some of the waiver information.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1 schematically illustrates a process flow for creating and managing waiver descriptions, according to an exemplary embodiment. As previously described, foundries specify their own physical design parameters such as area, grid, length, size, spacing, corner, enclosure, intersection, and overlap of geometric element(s) for IC compliance with their processes, equipment, and techniques. Accordingly, an overall design flow may include at least one process flow intended to confirm that design data corresponding to, for example, a physical IP block design, complies with specified parameters. In this manner, process flow 100 includes an "initial" design verification process 101, such as a DRC process, that may be performed against one or more physical IP block designs utilizing one or more design rules regarding one or more parameters. DRC processes typically run comprehensive design rule checks on one or more repositories containing physical layouts of an IC design to be verified, such as one or more physical IP block designs to be verified. Since the geometric element(s) of a physical layout (which may relate to edges, polygons, shapes, and/or vertices of a structure defining at least one portion of a physical IP block design) typically dictate whether the pattern will result in features that have the desired shapes and/or sizes, operations performed by process 101 may include, among other things, checking the geometric element(s) of a physical layout for violations of specified tolerances.

Physical IP block designs may be stored to, for example, IP block designs repository 103. Design rules may be stored to, for instance, design verification rules repository 105. During process 101, one or more violations of the design rules may be determined, and thereby, identified or otherwise reported. These violations may be associated with one or more aspects of the physical IP block designs, such as those corresponding to the geometric element(s) of the physical IP block designs. Any given violation will be associated with at least one geometric element of a physical IP block design or of a cell of the physical IP block design. As such, a violation may be considered a geometric element violation corresponding to the physical IP block design including the geometric element, or corresponding to the cell of a physical IP block design that includes the geometric element. Resulting geometric element violations may be stored to, for example, geometric element violations repository 107. The geometric element violations may be stored in association with one or more identifiers, physical descriptions, or other parameters, such as one or more identifiers, physical descriptions, or other parameters of the geometric elements, of the cells including the geometric elements, and/or of the blocks including the geometric elements. Exemplary identifiers, physical descriptions, or other parameters may also include those characterizing one or more names, checksums, and/or the like, as well as combinations thereof.

Geometric element violations stored to repository 107 may be waived via violation waiver process 109. Violation waiver may be performed at any suitable granularity, such as on a per geometric element violation basis. In this manner, each geometric element violation stored to repository 107 may be further stored in association with corresponding geometric element violation waivers. One or more waiver descriptions may be generated by waiver description generation process 111, which may be performed at any suitable granularity, such as on a per physical IP block design basis. Each waiver description may include those geometric element violation waivers respectively associated with a physical IP block design including the geometric elements resulting in the violations that have been waived. Waiver descriptions may be further associated with physical IP block designs including one or more cells having one or more geometric elements therein. In this manner, waiver descriptions may include geometric element violation waivers respectively associated with cells of a physical IP block design including the geometric elements resulting in the violations that have been waived. Waiver descriptions generated via process 111 may be stored to, for example, waiver descriptions repository 113.

Generated waiver descriptions may be formatted in any suitable, commonly utilized format capable of integration with (or utilization by) one or more electronic design automation (EDA) tools. For example, waiver descriptions may be formatted in accordance with an American Standard Code for Information Interchange (ASCII) format. An exemplary waiver description (which may be stored as a file) and formatted in accordance with an ASCII format describing one or more design verification violations (e.g., geometric element violations) that have been, for instance, waived in association with a physical IP block design may be characterized as follows:

```
Waiver_Rule_Start
Cellname = < cellMasterName >
Cell_Checksum = < IP_Checksum >
Rule = < ruleName >
    Waive_By = | Vertex | Region [%] | Edge [Pair]
    Waive_Points_Start
    X1,Y1
    X2,Y2
    .
    .
    .
    Xi,Yi
    Waive_Points_End
Rule = < ruleName >
    Waive_By = | Vertex | Region [%]
    Waive_Points_Start
    Xi+1,Yi+1
    .
    .
    .
    Xn,Yn
    Waive_Points_End
.
.
.
Waiver_Rule_End
``` where:

| | |
|---|---|
| Waiver_Rule_Start = | Flag Indicating the Start of an IP ASCII DRC Waiver Description File |
| Waiver_Rule_End = | Flag Indicating the End of an IP ASCII DRC Waiver Description File |
| Cellname = | The Master Cell Name Indicating the Location of Waived Geometric Element Violations (Cellname may Contain "Wild Card" Values) An Optional Parameter that may be Utilized in Association with Instances when the Master Cell Name is not Known or Arbitrarily Established |
| Cell_Checksum = | Cell Checksum Value that Uniquely Identifies a Physical Cell Design of a Physical IP Block Design, the Physical Cell Design Having a Geometric Layout Defined by one or more Parameters that may be Utilized to Determine the Cell Checksum Value |
| Rule = | The Rule Number Within DRC Deck and Design Manual of Waived Geometric Element Violation |

-continued

| | |
|---|---|
| Waive_By = | Handling of Waived Geometric Element Violation |
| \| = | Denotes an Option Between Defining a Vertex, Region [%], or Edge [Pair] |
| Vertex = | Encountered Violation must Exactly Match Shape of Waiver Geometric Element (Encountered Violations Smaller or Bigger than Waiver Geometric Element are not Waived) |
| Region = | The Violation may be Smaller than the Shape of the Waiver Geometric Element; as long as the Violation falls within Waiver Geometric Element, Violation is Waived or Otherwise Disregarded (Region may be optionally controlled via percentage parameter, i.e., [%]) |
| [%] = | Percentage Parameter with the following Exemplary Values: 100 → Similar Effect as least Vertex 90 → Error must Match at 90% of Waived Geometric Element Shape (Error must be Fully Circumscribed within Shape of Waived Geometric Element) |
| Edge = | Defines Waived Geometric Element as an Edge that must be Exactly Matched (First set of Numerical Coordinates Define First Edge, e.g., X1, Y1 (May be Optionally Controlled via Edge Parameter, i.e., [Pair]) |
| [Pair] = | Edge Parameter Utilized to Optionally Define Waived Geometric Element as a Pair of Edges (Pair of Edges are Interchangeable) (Second set of Numerical Coordinates Define Second Edge) |
| Xn = | $N^{th}$ Numerical Coordinate Indicating Signed Distance from an "X" Coordinate Axis |
| Yn = | $N^{th}$ Numerical Coordinate Indicating Signed Distance from a "Y" Coordinate Axis |
| Xn,Yn | $N^{th}$ Pair of Numerical Coordinates Defining $N^{th}$ Point of Waiver Geometric Element |
| Waive_Points_Start = | Flag Indicating Start of Pairs of Coordinates of Waiver Geometric Element |
| Waive_Points_End = | Flag Indicating End of Pairs of Coordinates of Waiver Geometric Element |

As previously described, there may be one-to-one correspondence between waiver descriptions and physical IP block designs, such that design validation for any particular physical IP block design (whether or not the physical IP block design includes a plurality of cells) may be governed by a corresponding waiver description. Accordingly, any revisions (or modifications) made to a particular physical IP block design will only affect (if at all) the respective waiver description governing design validation of that particular physical IP block design. In a similar manner, any revisions made to a particular cell of a physical IP block design will only affect (if at all) a respective portion of the respective waiver description governing design validation of the physical IP block design including the particular cell. Further, since waiver descriptions may be generated on a per physical IP block design per geometric element violation waiver basis, any revisions made to a particular geometric element of a physical IP block design will only affect (if at all) the respective waiver descriptions associated with that particular geometric element. This saves design debugging time and resources, while also enabling a faster time to tapeout. Any revisions to the design rules will only affect (if at all) those waiver descriptions governing design validation for those physical IP block designs for which the revised design rule(s) apply. Given, however, that waiver descriptions may be generated on a per physical IP block design per design rule basis, any revisions made to a particular design rule may only affect (if at all) the respective waiver descriptions associated with that particular revised design rule. Again, this saves design debugging time and resources, as well as enables a faster time to tapeout. When a physical IP block design includes multiple cells, corresponding waiver descriptions formatted in accordance with, for instance, an ASCII format, may be characterized as follows:

```
Waiver_Rule_Start
Cell1_Name = < cellMasterName >
Cell1_Checksum = < IP_Checksum >
    Rule = < ruleName >
        Waive_By = | Vertex | Region [%] | Edge [Pair]
        Waive_Points_Start
        X1,Y1
        X2,Y2
        Waive_Points_End
    Rule = < ruleName >
        .
        .
        .
Cell2_Name = < cellMasterName >
Cell2_Checksum = < IP_Checksum >
        .
        .
        .
Celln_Name = < cellMasterName >
Celln_Checksum = < IP_Checksum >
        .
        .
        .
Waiver_Rule_End
``` where:

| | |
|---|---|
| Cell1_Name = | The Master Cell Name of a First Cell Included in a Physical IP Block Design Having a Plurality of Cells, the Master Cell Name of the First Cell Indicating the Location of Waived Geometric Element Violations in the First Cell (Cell1_Name may Contain "Wild Card" Values) An Optional Parameter which may be Utilized in Association with Instances when the Master Cell Name is not Known or Arbitrarily Established |
| Cell1_Checksum = | First IP Block Cell Checksum Value that Uniquely Identifies a First Physical Cell Design of a Physical IP Block Design Including a Plurality of Physical Cell Designs, the First Physical Cell Design Having a Geometric Layout Defined by one or more Parameters that may be Utilized to Determine the First IP Block Cell Checksum Value |
| Cell2_Name = | The Master Cell Name of a Second Cell Included in a Physical IP Block Design Having a Plurality of Cells, the Master Cell Name of the Second Cell Indicating the Location of Waived Geometric Element Violations in the Second Cell (Cell2_Name may Contain "Wild Card" Values) An Optional Parameter which may be Utilized in Association with Instances when the Master Cell Name is not Known or Arbitrarily Established |
| Cell2_Checksum = | Second IP Block Cell Checksum Value that Uniquely Identifies a Second Physical Cell Design of a Physical IP Block Design Including a Plurality of Physical Cell Designs, the Second Physical Cell Design Having a Geometric Layout Defined by one or more Parameters that may be Utilized to Determine the Second IP Block Cell Checksum Value |
| . | . |
| . | . |
| . | . |
| Celln_Name = | The Master Cell Name of the $N^{th}$ Cell Included in a Physical IP Block Design Having a Plurality of Cells, the Master Cell Name of the $N^{th}$ Cell Indicating the Location of Waived Geometric Element Violations in the $N^{th}$ Cell (Celln_Name may Contain "Wild Card" Values) An Optional Parameter which may be Utilized in Association with Instances when the Master Cell Name is not Known or Arbitrarily Established Checksum Value |
| Celln_Checksum = | $N^{th}$ IP Block Cell Checksum Value that Uniquely Identifies the $N^{th}$ Physical Cell Design of a Physical IP Block Design Including a Plurality of Physical Cell Designs, the $N^{th}$ Physical Cell Design Having a Geometric Layout Defined by one or more Parameters that may be Utilized to Determine the $N^{th}$ IP Block Cell |

With continued reference to FIG. 1, as previously described, physical IP block designs and design rules are periodically subject to one or more revisions or modifications. Therefore, process flow 100 not only enables the creation of one or more waiver descriptions, but also enables the waiver descriptions to be revised (or otherwise managed) when, for instance, physical IP block designs and/or design rules are modified. To facilitate the management of one or more waiver descriptions, process 100 includes regression information generation process 115. Process 115 may utilize one or more parameters (or other information) associated with waived geometric element violations to generate regression information. These parameter(s) may be received or retrieved from repository 107. Exemplary regression information may include one or more checksum values that enable "subsequent" design verification operations to efficiently and uniquely identify recurring geometric element violations that have already been waived, and as a result, do not require any further analysis and/or debugging. In this manner, these checksum values may be referred to as geometric element checksums, as they also uniquely identify respective geometric elements associated with corresponding geometric element violations, whether or not the geometric element violations have been waived. As will become more apparent below, comparison of geometric element checksum values, such as the comparison of a plurality of first geometric element checksum values associated with waived first geometric element violations with a second geometric element checksum value associated with a second geometric element violation, may be utilized to determine whether the second geometric element violation is a recurring geometric element violation that has been waived, and, therefore, does not require further analysis and/or debugging. Non-recurring geometric element violations may be addressed in any suitable manner, e.g., debugged, waived, etc.

Geometric element checksum values associated with geometric element violations, whether or not waived, may be determined based on one or more checksum functions. Exemplary checksum functions may incorporate (or utilize) one or more characteristics associated with geometric element violations to determine corresponding geometric element violation checksum values. These characteristics may relate to one or more parameters (or values) corresponding to a design rule and coordinates of a geometric element associated with a geometric element violation. For instance, a geometric element checksum value associated with a first waived geometric element violation may incorporate parameters corresponding to the design rule that was applied to identify the first geometric element violation and parameters corresponding to one or more coordinates defining the first waived geometric element violation in, for instance, a coordinate space. An exemplary checksum function (1) is provided below:

$$Checksum = (Rule\#) : \left(\sum_{i=1}^{n} X_i\right) : \left(\sum_{i=1}^{n} Y_i\right) \quad (1)$$

where:

| | |
|---|---|
| Checksum = | Geometric Element Checksum Value Associated with Geometric Element Violation |
| Rule# = | Design Verification Rule Number Associated with Design Verification Rule Applied Against Geometric Element to Cause Geometric Element Violation |
| $X_i$ = | Value of $i^{th}$ "X" Coordinate Associated with $i^{th}$ Point Utilized to Define Geometric Element/Geometric Element Violation |
| $Y_i$ = | Value of $i^{th}$ "Y" Coordinate Associated with $i^{th}$ Point Utilized to Define Geometric Element/Geometric Element Violation |
| n = | Total Number of Points Utilized to Define Geometric Element/Geometric Element Violation |

Generated geometric element checksum values, as well as any other suitable regression information (e.g., information relating to whether or not a geometric element violation associated with a generated geometric element checksum value has been waived), may be stored to, for example, regression information repository 117. According to particular embodiments, geometric element checksum values may be further stored to repository 117 in association with an identifier corresponding to a cell of a physical IP block design including the geometric element violation associated with the geometric element checksum value. In those instances when a physical IP block design includes a plurality of cells, the identifier may uniquely identify the particular cell including the geometric element violation associated with the geometric element violation. When a physical IP block design only includes one cell, the identifier will correspond to an identifier of the physical IP block design. Exemplary identifiers may include or relate to a name corresponding to the cell of the physical IP block design (e.g., cell master name) and/or a checksum corresponding to the cell of the physical IP block design (e.g., cell checksum value when the physical IP block design includes a plurality of cells, otherwise IP block checksum value when the physical IP block design includes one cell).

As previously described, revisions to design rules and physical IP block designs may require revised design verification decks that include the revised design rules or account for modifications to the physical IP block designs. To eliminate (or reduce) the identification of previously debugged and/or waived geometric element violations, previously generated waiver descriptions stored to repository 113 may also be revised to account for the revision of the design rules and/or physical IP block designs. Revision of these waiver descriptions may be facilitated through one or more processes, such as "subsequent" design verification process 119, violation waiver process 121, and waiver modification process 123.

"Subsequent" design verification process 119 may be performed against one or more physical IP block designs (which may have been revised) utilizing design rules (which may have been revised). To facilitate the efficient identification of recurring geometric element violations that have been waived, and as a result, do not require any further analysis and/or debugging, process 119 may utilize regression information from repository 117. Non-recurring (or discrepancy) geometric element violations may also be efficiently identified through process 119 and, thereafter, be debugged and waived. Generated waiver descriptions may be modified based on the newly waived, discrepancy geometric element violations, as well as revised based on unnecessary waiver information related to one or more geometric element violations that no longer occur within the physical IP block design, i.e., geometric element violations that were previously identified and waived during processes 101 and 109, but no longer occur during process 119. Process 119 may be performed against one or more physical layouts (e.g., physical IP block designs) stored to an IP block design repository 125 utilizing design rules stored to design verification rules repository 127, as well as regression information from repository 117. In certain instances, repository 125 may correspond to repository 103, i.e., when no revisions are imposed upon existing physical IP block designs; however, in other instances, repository 125 may include one or more IP design revisions 129, and, thereby, may be a revised version of repository 103 that accounts for such IP design revisions 129. Likewise, repository 127 may correspond to repository 105, i.e., when no revisions are imposed upon existing design rules; however, in certain instances, repository 127 may include one or more design rule revisions 131, and, thereby, may be a revised version of repository 105 that accounts for such design rule revisions 131.

Process 119 may determine one or more "discrepancy" geometric element violations, which is described in more detail in association with FIG. 2. Process 119 may determine discrepancy geometric element violations uniquely resulting from the application of IP design revisions 129 and/or design rule revisions 131 through the utilization of one or more comparison processes carried out via checksum comparison module 133 against one or more checksums stored to repository 117 and one or more checksums determined or generated by checksum module 135. For instance, process 119 may compare respective geometric element checksums associated with previously waived geometric element violations with geometric element checksums associated with geometric element violations identified during process 119 to identify discrepancy geometric element violations resulting from the introduction of IP design revisions 129 and/or design rule revisions 131. Discrepancy geometric element violations may be stored to discrepancy geometric element repository 137. In certain instances, other information may be stored to repository 137 to account for previously identified and waived geometric element violations that are not matched with at least one geometric element violation occurring during process 119. As previously described and will be described in more detail below, discrepancy geometric element violations, as well as other information stored to repository 137 may be utilized during process 123 to modify one or more waiver descriptions. Discrepancy geometric element violations and/or the other information may be stored to repository 137 in association with one or more identifiers, physical descriptions, and/or other parameters, such as one or more of the aforementioned identifiers, physical descriptions, and/or other parameters utilized in association with repository 107.

Discrepancy geometric element violations may be analyzed, debugged, and/or waived via violation waiver process 121, which may be performed at any suitable granularity, such as on a per discrepancy geometric element violation basis. Repository 137 may further store discrepancy geometric element violations (and/or the other information) in association with one or more corresponding waivers thereof. Waiver description modification process 123 may be utilized to update those waiver descriptions stored in repository 113 and associated with, for example, physical IP block designs that include one or more waived discrepancy geometric element violations. Modifications implemented via process 123 may be based on discrepancy geometric element violations and/or other information stored to repository 137. As with violation waiver, waiver description modification may be performed at any suitable granularity, such as on a per physical IP block design basis. As will become more apparent below, one or more revised waiver descriptions may be provided to users to facilitate design verification operations, such as DRC operations. Further, regression information stored to regression information repository 117 may be revised through regression information modification process 139 utilizing discrepancy geometric element violations and/or other information stored to repository 137.

FIG. 2 is a flowchart of a process for determining discrepancy geometric element violations, according to an exemplary embodiment. For illustrative purposes, the process is described with reference to FIG. 1. The steps of the process may be performed in any suitable order, as well as combined or separated in any suitable manner. The process described in FIG. 2 begins with an assumption that one or more first design verification violations (e.g., first geometric element violations) have already been identified by "initial" design verification process 101 and any individual first design verification violation is uniquely associated with a design rule that was applied against the physical layout and resulted in the design verification violation, and is uniquely associated with a waiver of the individual design verification violation. Individual design verification violations that have been waived may be respectively associated with one or more first checksums stored to repository 117. Exemplary first checksums may include one or more checksums associated with the physical layout and with the first design verification violation(s) that have been waived, such as one or more cell checksum values, IP block checksum values, and/or geometric element checksum values. The first waived design verification violations may also be respectively associated with version information, such as information related to a version of the design rules applied during process 101 and/or to a version of the physical layout analyzed via process 101.

The process also assumes that at least one second design verification violation (e.g., second geometric element violation) has been identified by, for instance, "subsequent" design verification process 119, wherein the second design verification violation is uniquely associated with the design rules applied against the physical design during process 119. It is further assumed that "subsequent" design verification process 119 was performed in response to revision of at least one design rule utilized during "initial" design verification process 101 and/or revision of the physical layout analyzed via process 101. In this manner, the second design verification violation may be associated with a same or a revised (e.g., first or second) version of the design rule that was applied to the physical layout analyzed during process 101, as well as associated with a same or revised (e.g., first or second) version of the physical layout analyzed via process 101. Moreover, the second design verification violation may be associated with one or more second checksums. Exemplary second checksums may include one or more checksums associated with the version of the physical layout including the second design verification violation or a version of the design rule associated with the second design verification violation (e.g., an IP block checksum value and/or a cell checksum value) and a checksum associated with the second design verification violation (e.g., a geometric element checksum value).

Adverting to FIG. 2, at step 201, one or more first checksums corresponding to respective first waived geometric element violations associated with a block of an IC design (such as a physical IP block design) are received by, for example, checksum comparison module 133 from regression information repository 117. The first checksums may be first geometric element checksums. A second checksum corresponding to a second geometric element violation, identified during process 119, may also be received by checksum comparison module 133 from checksum module 135, per step 203. The second checksum may be a second geometric element checksum.

To determine whether the second geometric element violation is unique to at least one revision of the block design and/or at least one revision of the design rules applied against the block resulting in the second geometric element violation, checksum comparison module 133 determines, at step 205, whether the second checksum corresponds to at least one of the first checksums. If the second checksum corresponds to at least one of the first checksums, then the second geometric element violation is handled in a manner consistent with a waived geometric element violation. For instance, the second geometric element violation may be identified as a previously waived geometric element violation, and thereby, disregarded during subsequent debugging and waiver operations. If, however, the second checksum does not correspond to at least one of the first checksums, a discrepancy geometric element violation is stored to discrepancy geometric element violation repository 137, per step 207. It is further noted that any previously waived geometric element violations corresponding to first checksums that have not been matched to at least one second geometric element checksum and, thereby, at least one second geometric element violation may also be stored as discrepancy geometric element violations (or other information) to repository 137.

As previously described, discrepancy geometric element violations may be analyzed (e.g., debugged) and waived. FIG. 3 is a flowchart of a process for waiving discrepancy geometric element violations, according to an exemplary embodiment. For illustrative purposes, the process is described with reference to FIG. 1. The steps of the process may be combined or separated in any suitable manner. Adverting to step 301, a request may be generated to facilitate waiver of at least one discrepancy geometric element violation. According to certain embodiments, the request may be presented via a graphical user interface (GUI) to enable analysis and waiver of the discrepancy geometric element violation. In response to the request or presentation, a waiver of the discrepancy geometric element violation may, per step 303, be received. The discrepancy geometric element violation may be stored to discrepancy geometric element repository 137 in association with the waiver, per step 305.

Figure 4:
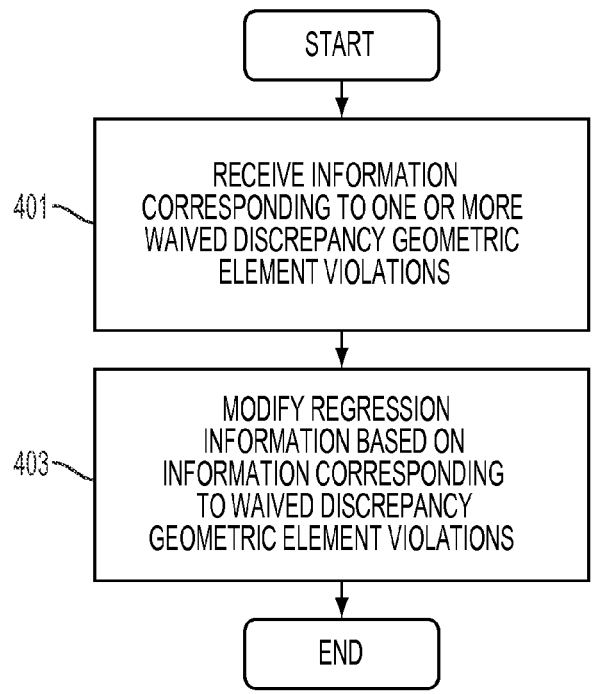
FIG. 4 is a flowchart of a process for updating regression information, according to an exemplary embodiment.

Further, information corresponding to waived discrepancy geometric element violations may be utilized to modify regression information. FIG. 4 is a flowchart of a process for updating regression information, according to an exemplary embodiment. For illustrative purposes, the process is described with reference to FIG. 1. The steps of the process may be combined or separated in any suitable manner. At step 401, information corresponding to one or more discrepancy geometric element violations and/or unmatched previously waived geometric element violations may be received by regression information modification process 139. This information may be received or retrieved from repository 137. In step 403, the information corresponding to the discrepancy geometric element violations and/or unmatched previously waived geometric element violations may be utilized by process 139 to modifying regression information stored to regression information repository 117. For example, information related to one or more waived discrepancy geometric element violations may be utilized to determine or generate one or more new checksum values in a manner consistent with Equation (1). These new checksum values may be utilized by process 139 to replace "old" checksum values associated with a physical IP block design including the waived discrepancy geometric element violations. In other instances, information related to one or more discrepancy geometric element violations associated with previously identified and waived geometric element violations (e.g., during processes 101 and 109) that were not matched with at least one subsequently identified geometric element violation (e.g., during process 119) may be utilized to remove one or more checksum values associated with the physical IP block design.

Figure 5:
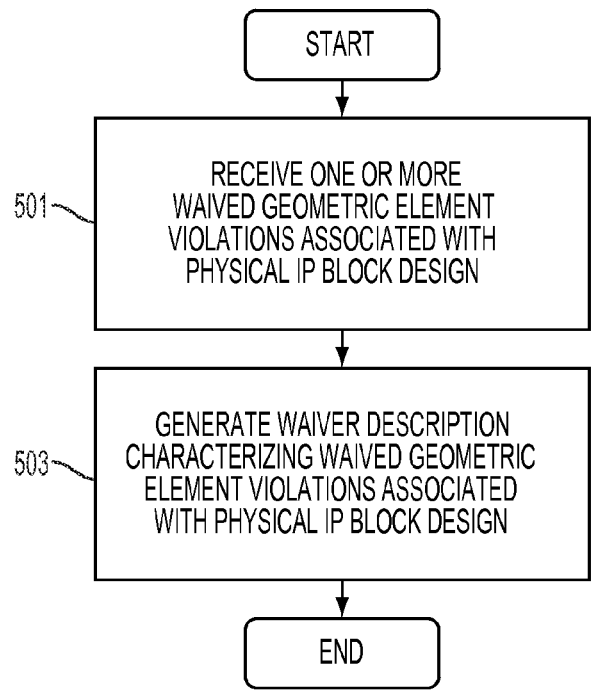
FIG. 5 is a flowchart of a process for updating waiver descriptions, according to an exemplary embodiment.

FIG. 5 is a flowchart of a process for updating waiver descriptions, according to an exemplary embodiment. For illustrative purposes, the process is described with reference to FIG. 1. The steps of the process may be combined or separated in any suitable manner. At step 501, one or more waived geometric element violations and/or unmatched previously waived geometric element violations (or information related thereto) associated with, for instance, a physical IP block design may be received by waiver description modification process 123. These waived geometric element violations and/or unmatched previously waived geometric element violations may relate to waived discrepancy geometric element violations and/or unmatched previously waived geometric element violations (or information related thereto) stored to repository 137. Accordingly, a waiver description associated with the physical IP block design may be modified to include waiver information characterizing the discrepancy geometric element violations that have been waived, such as waived in association with process 121, per step 503. Information related to one or more discrepancy geometric element violations associated with previously identified and waived geometric element violations (e.g., during processes 101 and 109) that were not matched with at least one subsequently identified geometric element violation (e.g., during process 119) may be utilized to remove waiver information from the waiver description that characterizes one or more geometric element violations that no longer occur within the physical IP block design.

Figure 6:
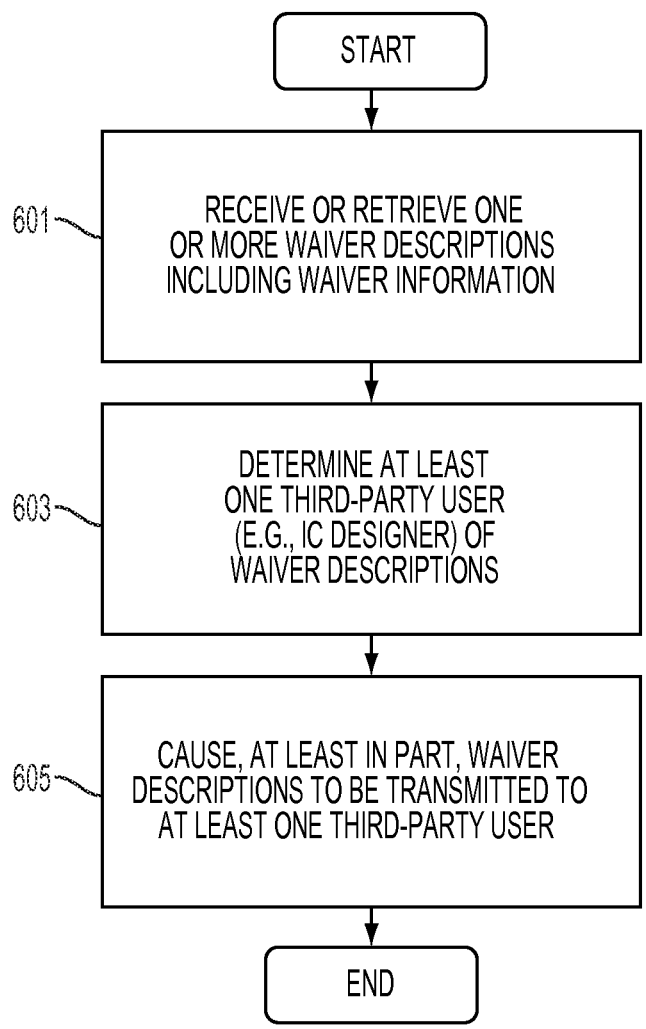
FIG. 6 is a flowchart of a process for transmitting waiver descriptions to at least one integrated circuit designer, according to an exemplary embodiment.

FIG. 6 is a flowchart of a process for transmitting waiver descriptions to at least one integrated circuit designer, according to an exemplary embodiment. The steps of the process may be performed in any suitable order, as well as combined or separated in any suitable manner. Adverting to step 601, one or more waiver descriptions including waiver information may be received or retrieved from repository 113. In step 603, at least one third-party user (e.g., IC designer) may be determined to receive the waiver descriptions. The waiver descriptions may, therefore, be caused, at least in part, to be transmitted to the at least one third-party IC designer over, for instance, one or more wired and/or wireless communication networks. It is particularly noted that waiver descriptions transmitted to third-party users may be provided as one or more ASCII formatted files respectively associated with corresponding physical IP block designs. These ASCII formatted files may include one or more checksum values; however, in exemplary embodiments, need not include any checksum values. Namely, checksum values associated with physical IP block designs may be utilized to create and manage corresponding waiver descriptions that govern design verification of the physical IP block designs, but are not necessary during design verification, i.e., when the waiver descriptions are to be utilized. During design verification, the ASCII formatted characterizations of waived geometric element violations (such as described above) may be utilized to uniquely identify and distinguish the waived geometric element violations from "other" geometric element violations that occur during, for example, full SoC design verification. In this manner, ASCII formatted waiver descriptions may be easily read and understood without the need for specialized EDA tools, program, scripts, or licenses. That is, the waiver descriptions may be viewed through any suitable text based (e.g., word processing) software application.

Figure 7:
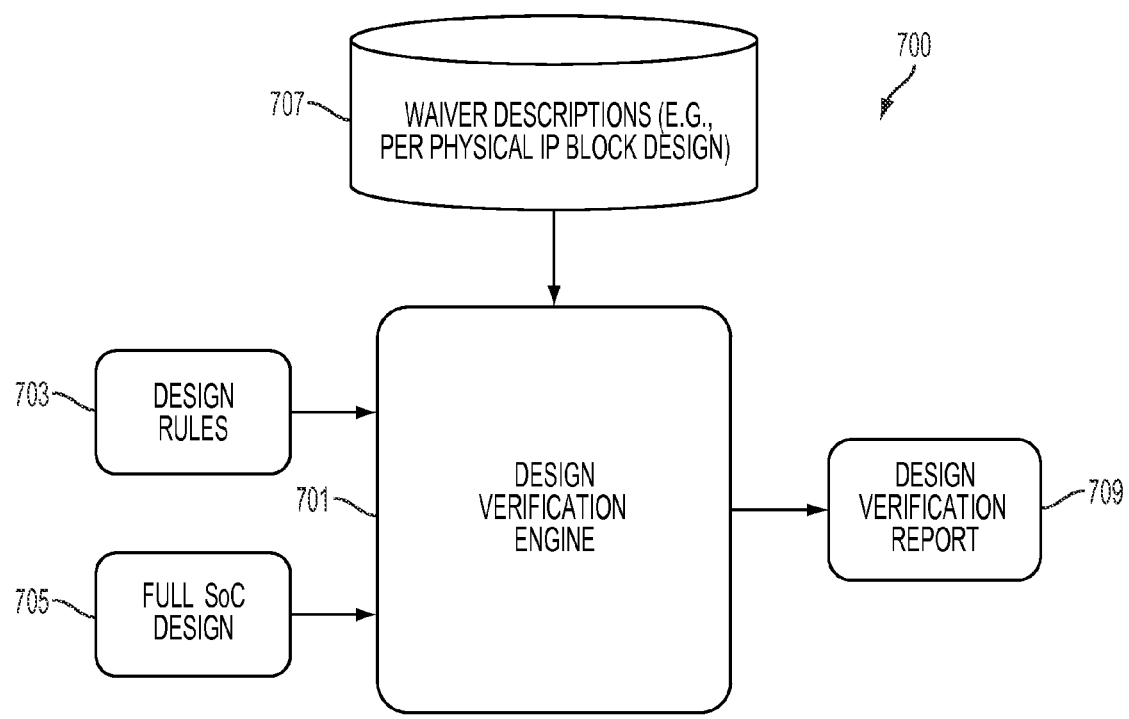
FIG. 7 schematically illustrates a system for utilizing waiver descriptions to facilitate design verification, according to an exemplary embodiment.

FIG. 7 schematically illustrates a system for utilizing waiver descriptions to facilitate design verification, according to an exemplary embodiment. System 700 includes design verification engine 701, such as a DRC engine, configured to apply one or more design verification rules (e.g., DRC rules) 703 against a full SoC design 705. In exemplary embodiments, full SoC design 705 includes one or more physical IP block designs respectively associated with one or more waived geometric element violations. In this manner, individual physical IP block designs included as part of full SoC design 705 may be respectively associated with waiver descriptions stored to waiver description repository 707. Waiver descriptions stored to repository 707 may include ASCII formatted characterizations of waived geometric element violations (hereinafter "waiver information") and, thereby, need not include any checksum values; however, may include checksum values if desired. As such, waiver information stored to respective waiver descriptions may be utilized by design verification engine 701 to uniquely identify and disregard geometric element violations that have been previously waived, and thereby, do not require debugging. Newly occurring design verification violations may be reported to an IC designer via design verification report 709, which may be presented to the IC designer via a GUI presentation.

Figure 8:
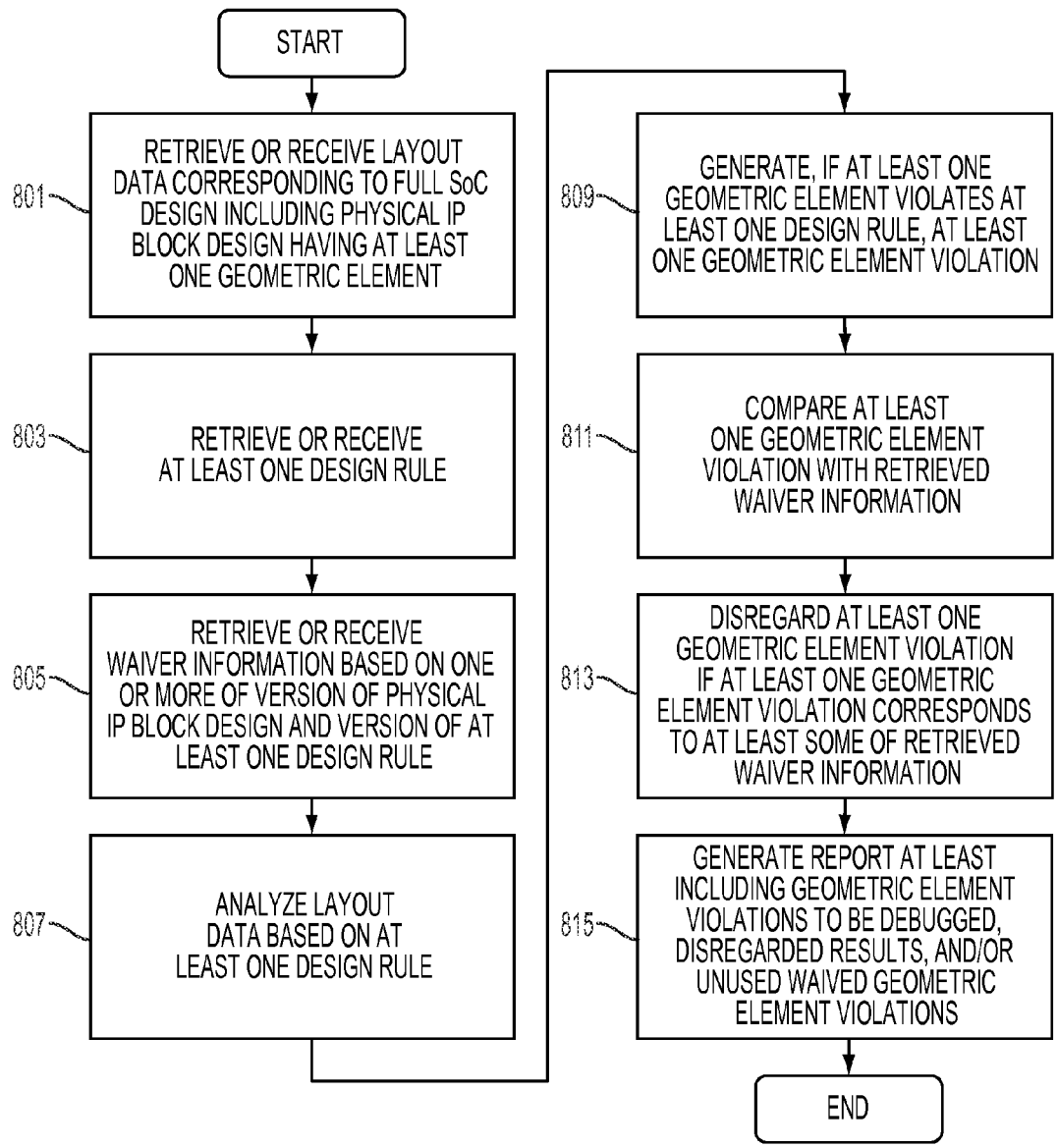
FIG. 8 is a flowchart of a process for utilizing waiver descriptions to facilitate design verification, according to an exemplary embodiment.

FIG. 8 is a flowchart of a process for utilizing waiver descriptions to facilitate design verification, according to an exemplary embodiment. The steps of the process may be performed in any suitable order, as well as combined or separated in any suitable manner. The process provides an exemplary method of checking a full SoC physical layout for design rule violations by, for instance, operations to determine a match between at least some waiver information stored to a waiver description and a first portion of the full SoC physical layout (e.g., a physical layout portion corresponding to a physical IP block design layout) containing a suspected violation of at least one design rule. This waiver description may be one of a plurality of waiver descriptions that are retained within one or more waiver description libraries which may be stored to, for instance, repository 707.

Adverting to FIG. 8, layout data 705 corresponding to a full SoC design that includes at least one block of IP having at least one geometric element may be retrieved or received by design verification engine 701, per step 801. In step 803, at least one design rule 705 may be retrieved or received by design verification engine 701 for application against the full SoC design. Waiver information may be retrieved (per step 805) from repository 707 based on version information corresponding to a version of the physical IP block design(s) included as part of the full SoC design 705, as well as based on a version of the design rules 703 to be applied against the full SoC design 705 by design verification engine 701.

At step 807, design verification engine 701 analyzes layout data 705 based on design rules 703. If at least one geometric element of layout data 705 violates at least one of design rules 703, design verification engine may generate at least one geometric element violation, per step 809. At step 811, design verification engine 701 may compare the at least one generated geometric element violation (or information corresponding thereto) with retrieved waiver information, e.g., ASCII formatted characterizations of previously waived geometric element violations associated with the version of the physical IP block designs being analyzed and in association with the version of the design rules being applied. If the at least one generated geometric element violation corresponds to at least some of the retrieved waiver information, then the generated geometric element violation may be disregarded, per step 813. If, however, the geometric element violation does not correspond to at least some of the retrieved waiver information, the generated geometric element violation may be included as part of a report (e.g., design verification report 709), in step 815. The report may be presented to an IC designer via any suitable method, such as via one or more GUIs. Further, the report may include those waivers used (i.e., geometric element violations occurring during step 809 but disregarded as waived geometric element violations during step 813), as well as include information indicating those geometric element violations that have been disregarded and/or those waived geometric element violations associated with the retrieved waiver information, but not matched to any generated geometric element violations identified via design verification engine 701.

The processes described herein may be implemented via software, hardware, firmware, or a combination thereof. Exemplary hardware (e.g., computing hardware) is schematically illustrated in FIG. 9. As shown, computer system 900 includes at least one processor 901, at least one memory 903, and at least one storage 905. Computer system 900 may be coupled to display 907 and one or more input devices 909, such as a keyboard and a pointing device. Display 907 may be utilized to provide one or more GUI interfaces, such as one or more design verification interfaces. Input devices 909 may be utilized by users of computer system 900 to interact with, for instance, the GUI interfaces. Storage 905 may store applications 911, layout data (or information) 913, design rules 915, and at least one database (or repository) 917. Applications 911 may include instructions (or computer program code) that when executed by processor 901 cause computer system 900 to perform one or more processes, such as one or more of the processes described herein. In exemplary embodiments, applications 911 may include one or more EDA tools, such as one or more design verification tools, which may be utilized to create and manage one or more waiver descriptions and/or regression information stored to database 915 based on layout data 913 and design rules 915. In other exemplary embodiments, applications 911 may include one or more EDA tools, such as one or more design verification tools, which may be utilized to identify and handle design verification violations in layout data 913 based on design rules 915 and waiver descriptions stored to database 917.

Embodiments of the present disclosure achieve several technical effects, such as enabling increased productivity in the creation of design verification waiver descriptions (e.g., DRC waiver descriptions) and providing automated analysis and/or management of these design verification waiver descriptions. Utilization of geometric element waiver checksums enables new (or revised) design verification descriptions to be created for updated design rules and/or updated physical IP block designs. In this manner, each new geometric element violation may be compared against existing waived geometric element violations by comparing respective checksums corresponding to the new geometric element violations and the existing waived geometric element violations. Such comparisons may be performed without executing a GDS layout file or performing a layout XOR comparison.

Other technical effects achieved by embodiments of the present disclosure include, for example, utilization of relatively simple checksum algorithms that incorporate, for instance, the coordinates of waived geometric element violations and design rule numbers associated with respective geometric element violations.

Embodiments of the present disclosure achieve additional technical effects, such as the distribution and utilization of generically formatted waiver descriptions, such as ASCII formatted waiver descriptions. In this manner, exemplary waiver descriptions need not include any proprietary information of EDA tool vendors, and therefore, can be easily translated for use with multiple EDA vendor design verification tools. Since IC designers may be provided with a single waiver description per physical IP block design, there is no requirement to create, maintain, or even distribute design verification waivers in GDS format, nor is a checksum required for design verification layout waivers. However, optional IP block checksums and/or cell checksums may be utilized for instances when a cell name is unknown, e.g., an instance when a cell name of the instance is user-defined or arbitrarily selected. Moreover, exemplary waiver descriptions need not be embedded in layout data corresponding to a physical IP block design, and, therefore, need not be kept in synchronization with their associated physical IP block designs. Also, because the waiver descriptions may be formatted in accordance with an ASCII format, the waiver descriptions may be easily read and understood without the need for a special EDA tool, program, script, or license. Namely, ASCII formatted characterizations of waived geometric element errors may be text based and directly correspond to parameters defining waived geometric element errors, as opposed to checksum values determined based on, for example, the parameters through a checksum function. In this manner, the waiver descriptions, e.g., ASCII formatted characterizations, may be viewed through any suitable text based (e.g., word processing) software application, which may be accessed through any suitable operating system or platform.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
receiving a plurality of first checksums corresponding to respective first geometric element errors waived on a per geometric element violation basis for each corresponding first checksum where each respective geometric element is part of a block of an integrated circuit design and each respective geometric element relates to edges, polygons, shapes, and/or vertices of a structure defining a portion of a physical integrated circuit, the plurality of first checksums being based on a first version of at least one design verification rule;
receiving a second checksum corresponding to a second geometric element error associated with the block, the second checksum being based on a second version of the at least one design verification rule;
determining whether the second checksum corresponds to at least one of the plurality of first checksums; and
generating, if the second checksum does not correspond to at least one of the plurality of first checksums, a waiver request for the second geometric element error,
wherein at least one step of said method is executed by a processor and the processor utilizes one or more parameters associated with waived geometric element violations for generating regression information.

2. The method according to claim 1, further comprising:
receiving, in response to the waiver request, an indication that the second geometric element error comprises a false geometric element error.

3. The method according to claim 2, further comprising:
storing, in response to receiving the indication, a plurality of third checksums,
wherein the plurality of third checksums correspond to waivers of the respective first geometric element errors and the second geometric element error.

4. The method according to claim 3, further comprising:
storing the plurality of third checksums in association with an identifier associated with a cell of the block.

5. The method according to claim 4, wherein the identifier comprises one or more checksums corresponding one or more DRC error polygons in the block.

6. The method according to claim 4, wherein the identifier comprises a name corresponding to the cell of the block.

7. The method according to claim 3, further comprising:
generating waiver information characterizing the respective first geometric element errors and the second geometric element error.

8. The method according to claim 7, further comprising:
formatting the waiver information in accordance with an ASCII format.

9. The method according to claim 1, wherein the regression information includes one or more checksum values that enable subsequent design verification operations to uniquely identify recurring geometric element violations that have already been waived.

10. The method according to claim 1, wherein, if the second checksum does not correspond to at least one of the plurality of first checksums, the second geometric element error is stored as a discrepancy geometric element violation.

11. The method according to claim 10, wherein the regression information is stored in a repository and revised through a regression information modification process utilizing the stored discrepancy geometric element violations.

12. A method comprising:
receiving a plurality of first checksums corresponding to respective first geometric element errors waived on a per geometric element violation basis for each corresponding first checksum where each respective geometric element is part of a first version of a block of an integrated circuit design and each respective geometric element relates to edges, polygons, shapes, and/or vertices of a structure defining a portion of a physical integrated circuit;
receiving a second checksum corresponding to a second geometric element error waived in association with a second version of the block;
determining whether the second checksum corresponds to at least one of the plurality of first checksums; and
generating, if the second checksum does not correspond to at least one of the plurality of first checksums, a waiver request for the second geometric element error,
wherein at least one step of said method is executed by a processor and the processor utilizes one or more parameters associated with waived geometric element violations for generating regression information.

13. The method according to claim 12, further comprising:
receiving, in response to the waiver request, an indication that the second geometric element error comprises a false geometric element error.

14. The method according to claim 13, further comprising:
storing, in response to receiving the indication, a plurality of third checksums,
wherein the plurality of third checksums correspond to waivers of the respective first geometric element errors and the second geometric element error.

15. The method according to claim 14, further comprising:
storing the plurality of third checksums in association with an identifier associated with a cell of the second version of the block.

16. The method according to claim 15, wherein the identifier comprises a checksum corresponding to the cell of the second version of the block.

17. The method according to claim 15, wherein the identifier comprises a name corresponding to the cell of the second version of the block.

18. The method according to claim 14, further comprising:
generating waiver information characterizing the respective first geometric element errors and the second geometric element error.

19. The method according to claim 18, further comprising:
formatting the waiver information in accordance with an ASCII format.

20. A method comprising:
analyzing, based on at least one design verification rule, layout data corresponding to an integrated circuit including a block of intellectual property having at least one geometric element relating to edges, polygons, shapes, and/or vertices of a structure defining at least one portion of a physical integrated circuit;
generating, if the at least one geometric element relating to edges, polygons, shapes, and/or vertices of the structure defining the least one portion of the physical integrated circuit violates the at least one design verification rule, at least one geometric element error for each violation by the at least one geometric element on a per geometric element violation basis;
comparing the at least one geometric element error with waiver information stored in association with a version of the block; and
disregarding the at least one geometric element error if the at least one geometric element error corresponds to at least some of the waiver information,
wherein at least one step of said method is executed by a processor and the processor utilizes one or more parameters associated with waived geometric element violations for generating regression information.

21. A method according to claim 20, wherein the waiver information is further stored in association with a version of the at least one design verification rule.

22. A method according to claim 21, further comprising:
retrieving the waiver information based on one or more of the version of the block and the version of the at least one verification rule.

23. A method according to claim 20, wherein the waiver information is formatted in accordance with an ASCII format.

* * * * *